United States Patent
Signoff et al.

(10) Patent No.: US 9,590,566 B2
(45) Date of Patent: Mar. 7, 2017

(54) PRE-DISTORTION BASED POWER CONTROL

(71) Applicant: Marvell World Trade Ltd., St. Michael (BB)

(72) Inventors: David M. Signoff, Santa Clara, CA (US); Renaldi Winoto, Danville, CA (US)

(73) Assignee: MARVELL WORLD TRADE LTD., St. Michael (BB)

(*) Notice: Subject to any disclaimer, the term of this patent is extended or adjusted under 35 U.S.C. 154(b) by 194 days.

(21) Appl. No.: 14/523,402

(22) Filed: Oct. 24, 2014

(65) Prior Publication Data

US 2015/0116032 A1    Apr. 30, 2015

Related U.S. Application Data

(60) Provisional application No. 61/895,172, filed on Oct. 24, 2013.

(51) Int. Cl.
| | | |
|---|---|---|
| *H03F 1/26* | (2006.01) | |
| *H03F 1/32* | (2006.01) | |
| *H03F 1/02* | (2006.01) | |
| *H03F 3/24* | (2006.01) | |

(52) U.S. Cl.
CPC ......... *H03F 1/3241* (2013.01); *H03F 1/0233* (2013.01); *H03F 3/245* (2013.01); *H03F 2201/3215* (2013.01)

(58) Field of Classification Search
CPC .......................................... H03F 1/26
USPC .................. 330/149; 375/297; 455/114.3
See application file for complete search history.

(56) References Cited

U.S. PATENT DOCUMENTS

| | | | |
|---|---|---|---|
| 6,307,435 B1 | 10/2001 | Nguyen et al. | |
| 6,985,033 B1* | 1/2006 | Shirali | H03F 1/3247 330/149 |
| 2004/0121741 A1* | 6/2004 | Rashev | H03F 1/3211 455/114.3 |
| 2006/0022751 A1* | 2/2006 | Fuller | H03F 1/0211 330/136 |
| 2009/0015326 A1* | 1/2009 | Ito | H03F 1/3252 330/149 |
| 2010/0033246 A1* | 2/2010 | Draxler | H03F 1/3247 330/149 |

(Continued)

FOREIGN PATENT DOCUMENTS

JP    2011-193154 A    9/2011

OTHER PUBLICATIONS

International Search Report and Written Opinion for PCT/US2014/062206, filed Oct. 24, 2014.

*Primary Examiner* — Patricia T Nguyen

(57) ABSTRACT

An apparatus comprises an amplifier and a pre-distortion circuit coupled to an input of the amplifier. A saturation value of an input signal corresponds to a maximum output power of an output signal of the amplifier. An input target value of the input signal is determined according to the saturation value. The input target value is determined by subtracting an offset from the saturation value or by multiplying a ratio by the saturation value. An average value or an RMS value of the input signal is controlled to be substantially equal to the input target value. A method comprises determining an input target value according to a saturation value, and controlling an input signal according to the input target value.

19 Claims, 3 Drawing Sheets

(56) References Cited

U.S. PATENT DOCUMENTS

| | | |
|---|---|---|
| 2011/0136452 A1 | 6/2011 | Pratt et al. |
| 2012/0002752 A1 | 1/2012 | Coan et al. |
| 2012/0128098 A1* | 5/2012 | Haddad ................ H03F 1/3247 375/296 |
| 2012/0321018 A1 | 12/2012 | Chen et al. |
| 2013/0225099 A1* | 8/2013 | Vosburgh ............... H04B 1/525 455/78 |
| 2014/0292403 A1* | 10/2014 | Liu ....................... H03F 1/3241 330/149 |

* cited by examiner

PRE-DISTORTION BASED POWER CONTROL

CROSS REFERENCE TO RELATED APPLICATION

This present disclosure claims the benefit of U.S. Provisional Application No. 61/895,172, filed on Oct. 24, 2013, which is incorporated by reference herein in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

An amplifier such as a power amplifier in a wireless communication device may be required to produce a target power output. The target power output may be determined by regulations or by properties of a system or an integrated circuit that includes the power amplifier. The target power output may be determined according to a signal quality metric, such as a distortion metric, an Adjacent Channel Leakage Ratio (ACLR) metric, or an Error Vector Magnitude (EVM) metric.

The output power of the amplifier may vary as a result of conditions associated with the amplifier, such as one or more of a manufacturing process variation, a power supply voltage, a temperature, a frequency, a Voltage Standing Wave Ratio (VSWR), and a load impedance. Additionally, the amplifier may operate in a non-linear fashion; that is, an output signal produced by the amplifier may not have a linear relationship to an input signal provided to the amplifier.

SUMMARY

In an embodiment, an apparatus comprises an amplifier and a pre-distortion circuit coupled to an input of the amplifier. A saturation value of an input signal corresponds to a maximum output power of an output signal of the amplifier. An input target value of the input signal is determined according to the saturation value.

In an embodiment, the input target value is determined by subtracting an offset from the saturation value.

In an embodiment, the input target value is determined by multiplying a ratio by the saturation value.

In an embodiment, the input target value is determined according to a target value of a signal quality metric of the output signal of the amplifier.

In an embodiment, an average value of the input signal is controlled to be substantially equal to the input target value.

In an embodiment, a Root-Mean-Square (RMS) value of the input signal is controlled to be substantially equal to the input target value.

In an embodiment, the input signal is an input signal of the pre-distortion circuit.

In an embodiment, the amplifier is a digital power amplifier.

In an embodiment, the apparatus is provided using an integrated circuit.

In an embodiment, a method comprises determining an input target value according to a saturation value, and controlling an input signal according to the input target value.

In an embodiment, determining the input target value includes subtracting an offset from the saturation value.

In an embodiment, determining the input target value includes multiplying a ratio by the saturation value.

DETAILED DESCRIPTION

Figure 1:
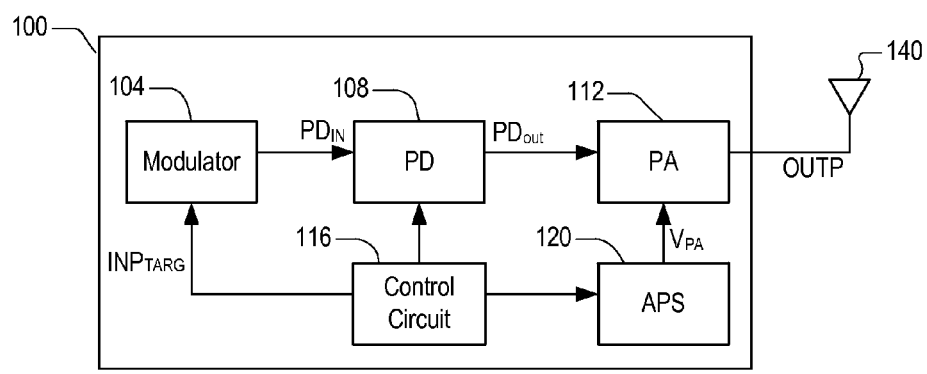
FIG. 1 illustrates a device according to an embodiment.

FIG. 1 illustrates a device 100 according to an embodiment. The device 100 includes a modulator 104, a pre-distortion circuit (PD) 108, a power amplifier (PA) 112, a control circuit 116, and an amplifier power supply (APS) 120. In an embodiment, the device 100 is a wireless communication device. In an embodiment, all or part of the device 100 is provided in an integrated circuit.

The modulator 104 generates a pre-distortion input signal $PD_{IN}$ according to a pre-distortion input target value $INP_{TARG}$ received from the control circuit 116. The modulator 104 provides the pre-distortion input signal $PD_{IN}$ to an input of the PD 108.

In an embodiment, the pre-distortion input target value $INP_{TARG}$ controls an average value of the pre-distortion input signal $PD_{IN}$. In another embodiment, the pre-distortion input target value $INP_{TARG}$ controls a Root-Mean-Square (RMS) value of the pre-distortion input signal $PD_{IN}$.

In an embodiment, the pre-distortion input signal $PD_{IN}$ includes values encoded as a plurality of bits, that is, digital values. In an embodiment, the pre-distortion input signal $PD_{IN}$ includes values encoded into a continuum of voltage or current values, that is, analog values.

The PD 108 generates a pre-distortion output signal $PD_{OUT}$ according to the pre-distortion input signal $PD_{IN}$ and a plurality of parameters associated with the PA 112. The PD 108 is configured to pre-distort the pre-distortion input signal $PD_{IN}$ to generate the pre-distortion output signal $PD_{OUT}$, and thus compensates for nonlinearities of the PA 112. In an embodiment, the plurality of parameters includes a plurality of digital values. In an embodiment, the plurality of digital values includes coefficients of one or more transforms performed by the PD 108.

In an embodiment, the PD 108 is a Digital Pre-Distortion circuit (DPD) 108, wherein the pre-distortion input signal $PD_{IN}$ and the pre-distortion output signal $PD_{OUT}$ are digital signals. In an embodiment, the plurality of parameters of the PD 108 includes a Look-Up Table (LUT) mapping values of the pre-distortion input signal $PD_{IN}$ to values of the pre-distortion output signal $PD_{OUT}$. In an embodiment, the PD 108 includes a Digital Signal Processor (DSP) that computes values of the pre-distortion output signal $PD_{OUT}$ according to values of the pre-distortion input signal $PD_{IN}$ and the plurality of parameters. In an embodiment, the operations described herein as being performed by the PD 108 are performed, in whole or in part, by components of the modulator 104.

In another embodiment, the PD 108 is an analog pre-distortion circuit that produces analog values of the pre-distortion output signal $PD_{OUT}$ according to analog values of the pre-distortion input signal $PD_{IN}$ and the plurality of parameters.

In an embodiment, the PD 108 is a combination of digital circuits and analog circuits that produces analog values of the pre-distortion output signal $PD_{OUT}$ according to digital values of the pre-distortion input signal $PD_{IN}$ and the plurality of parameters.

A person of skill in the art in light of the teachings and disclosures herein would understand how to implement the PD 108.

The PA 112 receives the pre-distortion output signal $PD_{OUT}$ from the PD 108. The PA 112 amplifies the pre-distortion output signal $PD_{OUT}$ to produce a PA output signal OUTP. The PA 112 provides the PA output signal OUTP to an antenna 140.

In an embodiment, the PA 112 is a digital power amplifier 112, and the pre-distortion output signal $PD_{OUT}$ includes digital values. In an embodiment, the PA 112 is an analog PA 112, and the pre-distortion output signal $PD_{OUT}$ includes analog values.

Figure 2A:
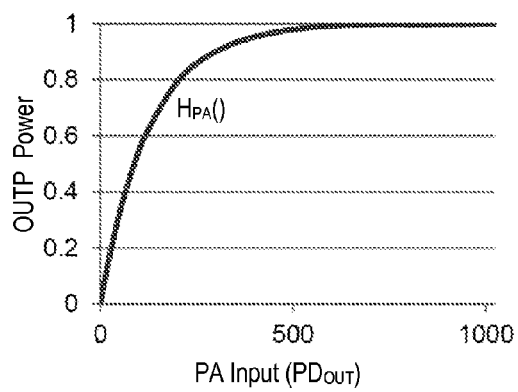
FIGS. 2A-2C illustrate operation of an amplifier, a pre-distortion circuit, and a combination of the pre-distortion circuit and amplifier, respectively, according to an embodiment.
Figure 2B:
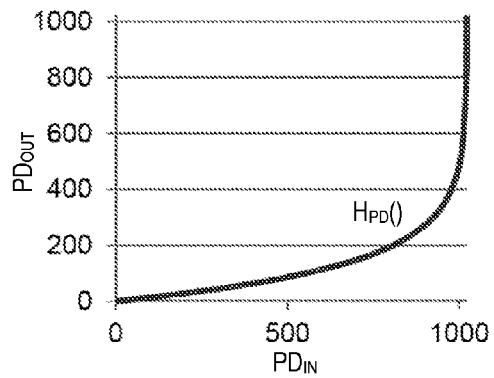
Figure 2C:
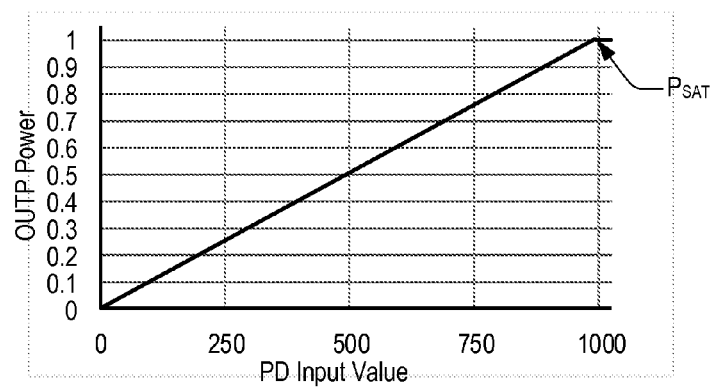

FIG. 2 illustrates the operation of the DP 108 and the PA 112. FIG. 2A shows a power of the PA output signal OUTP as a function of a value of the input of the PA 112 and illustrates a nonlinearity of a transfer function $H_{PA}(\ )$ that characterizes the PA 112. FIG. 2B shows the pre-distortion output signal $PD_{OUT}$ produced by the PD 108 as a function of the pre-distortion input signal $PD_{IN}$ and illustrates a pre-distortion, applied by the PD 108, characterized by a transfer function $H_{PD}(\ )$ of the PD 108. FIG. 2C illustrates the combined effect of the nonlinearity of the PA 112 and the pre-distortion applied by the PD 108.

FIG. 2A shows that as the value provided at an input of the PA 112 (e.g., the pre-distortion output signal $PD_{OUT}$ shown in FIG. 1) increases, the increase in a value of the PA 112 output signal OUTP for each successive unit increase in the value of the input of the PA 112 decreases, that is, the transfer function $H_{PA}(\ )$ of the PA 112 has an amplitude non-linearity. For example, an increase in the value provided at the input of the PA 112 from 50 to 100 produces a larger increase in the power of the PA output signal OUTP than an increase in the value provided at the input of the PA 122 from 450 to 500.

FIG. 2B shows the transfer function $H_{PD}(\ )$ of the PD 108 configured to compensate for the amplitude non-linearity of the transfer function $H_{PA}(\ )$ of the PA 112. When a value of the pre-distortion input signal $PD_{IN}$ is small, a unit change in the value produces a small change in the pre-distortion output signal $PD_{OUT}$. In contrast, when a value of the pre-distortion input signal $PD_{IN}$ is large, a unit change in the value produces a large change in the pre-distortion output signal $PD_{OUT}$.

The PD 108 is configured so that the transfer function $H_{PD}(\ )$ of the PD 108 is substantially equal to an inverse of the transfer function $H_{PA}(\ )$ of the PA 112. Accordingly, when the power of the output signal OUTP is less than the maximum output power $P_{SAT}$ of the PA 112, the combination of the PD 108 and the PA 112 shown in FIG. 1 produces a substantially linear relationship between the pre-distortion input signal $PD_{IN}$ and the output signal OUTP, as shown in FIG. 2C.

In an embodiment, the endpoints of the combined transfer function shown in FIG. 2C are substantially identical to the endpoints of the transfer function $H_{PA}(\ )$ of the PA 112. For example, in the embodiment illustrated in FIG. 2, a value of 0 of the pre-distortion input signal $PD_{IN}$ produces the same power (that is, no power) of the output signal OUTP as a value of zero at the input of the PA 112, and a value of 1000 of the pre-distortion input signal $PD_{IN}$ produces the same power (that is, the maximum output power $P_{SAT}$) of the output signal OUTP as a value of 1000 at the input of the PA 112.

In an embodiment, the PA 112 may be characterized by a plurality of transfer functions $H_{PA}(\ )$ each associated with values or ranges of one or more operating parameters. The operating parameters may include one or more of a frequency, a power supply voltage, a temperature, and so on. Accordingly, in this embodiment, the PD 108 may include a plurality of transfer functions $H_{PD}(\ )$ corresponding to the plurality of transfer functions $H_{PA}(\ )$, respectively, and the PD 108 may be controlled to use a transfer function of the plurality of transfer functions $H_{PD}(\ )$ according to the operating parameters.

In an embodiment, one or more of transfer functions $H_{PD}(\ )$ of the PD 108 may be determined during manufacturing of the PD 108. In an embodiment, one or more of transfer functions $H_{PD}(\ )$ of the PD 108 may be determined using a calibration procedure performed as part of the manufacturing of the PD 108. In an embodiment, one or more of transfer functions $H_{PD}(\ )$ of the PD 108 may be determined from time to time during operation of the device 100, and may be determined using a training process.

Although FIG. 2 only illustrates the transfer function $H_{PA}(\ )$ of the PA 112 having an amplitude nonlinearity and a corresponding inverse transfer function $H_{PD}(\ )$ of the PD 108, embodiments are not limited thereto. In an embodiment, the transfer function $H_{PA}(\ )$ of the PA 112 may include a phase nonlinearity, a memory effect, or both, and the transfer function $H_{PD}(\ )$ of the PD 108 includes the inverse transform corresponding to the phase nonlinearity, the memory effect, or both.

Although FIG. 2 illustrates the pre-distortion input signal $PD_{IN}$ and the pre-distortion output signal $PD_{OUT}$ having an identical range, embodiments are not limited thereto. In an embodiment, the range of the pre-distortion output signal $PD_{OUT}$ may be greater than or less than the range of the pre-distortion input signal $PD_{IN}$. In an embodiment, the precision of values of the pre-distortion output signal $PD_{OUT}$, such as the number of bits used to encode the values, may be different than the precision of the values of the pre-distortion input signal $PD_{IN}$.

Returning to FIG. 1, while the figure shows a device 100 that provides the PA output signal OUTP to the antenna 140, embodiments are not limited thereto. In an embodiment, the device 100 provides the output signal OUTP to a coaxial cable, twisted pair, stripline, printed-circuit board trace, or other form of wired communication channel. In another embodiment, the communication system 100 provides the output signal OUTP to an optoelectronic device, such as a laser diode or optical modulator, which may be coupled to an optical communication channel.

In an embodiment of the device 100, the APS 120 provides an amplifier supply voltage $V_{PA}$ to the PA 112. A voltage of the amplifier supply voltage $V_{PA}$ may be controlled according to a signal received by the APS 120 from the control circuit 116.

The voltage of the amplifier supply voltage $V_{PA}$ may be controlled according to a selected maximum output power $P_{SAT}$ of the PA 112, and may change over time as the selected maximum output power $P_{SAT}$ changes. A person of skill in the art in light of the teachings and disclosures herein would understand how to control the maximum output power $P_{SAT}$ of the PA 112 using the voltage of the amplifier supply voltage $V_{PA}$ and would understand how to implement the APS 120.

In an embodiment, the plurality of parameters used by the PD 108 to produce the pre-distortion output signal $PD_{OUT}$ may vary according to the voltage of the amplifier supply voltage $V_{PA}$ or according to the selected maximum output power $P_{SAT}$. In an embodiment, the PD 108 uses a potentially different plurality of parameters to produce the pre-distortion output signal $PD_{OUT}$ for each of a plurality of voltages of the amplifier supply voltage $V_{PA}$ or for each of a plurality of selected maximum output power $P_{SAT}$.

The control circuit 116 of the device 100 provides the pre-distortion input target value $INP_{TARG}$ to the modulator 104, controls the APS 120, and controls the PD 108.

The control circuit 116 may be configured to determine one or more pluralities of parameters used by the PD 108 to produce the pre-distortion output signal $PD_{OUT}$, such as by performing a calibration or training process.

The control circuit 116 may be configured to determine which of one or more pluralities of parameters the PD 108 uses to produce the pre-distortion output signal $PD_{OUT}$. The control circuit 116 may determine which plurality of parameters is to be used according to one or more of a selected maximum output power $P_{SAT}$, a temperature, a frequency, a target value of a signal quality metric, and the like.

In an embodiment, the control circuit 116 includes a processor executing computer programming instructions from a non-transitory computer readable media. A person of skill in the art in light of the teachings and disclosures herein would understand how to implement and program the control circuit 116.

Figure 3:
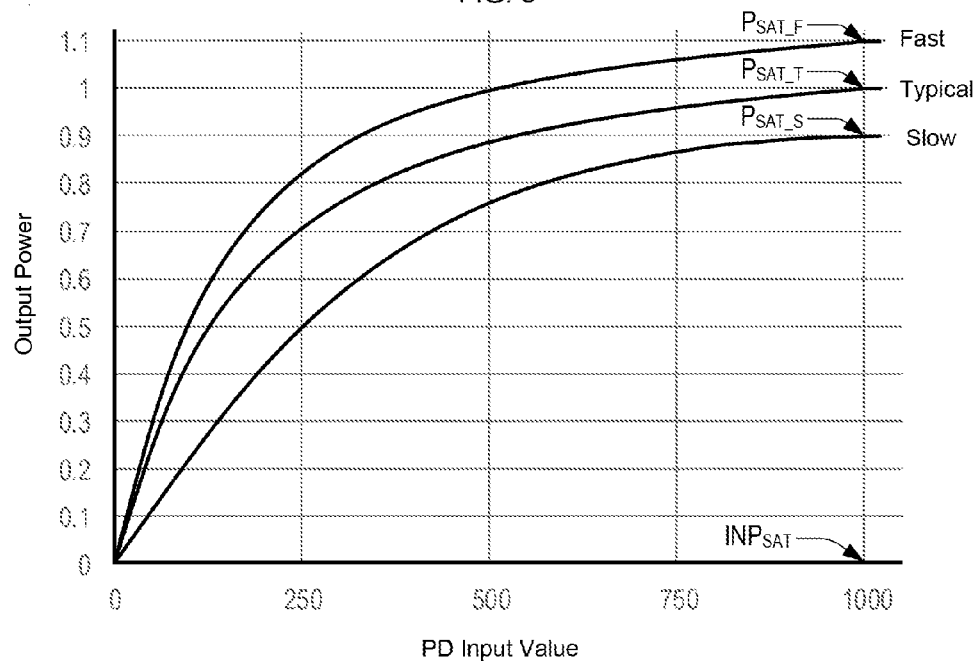
FIG. 3 illustrates an operation of amplifiers according to an embodiment.

FIG. 3 illustrates an operation of PAs according to an embodiment. In particular, FIG. 3 illustrates how a transfer function of a plurality of otherwise identical PAs may vary according to variations in a manufacturing process, even when all of the PAs are operating under the same conditions of voltage, temperature, and so on.

In FIG. 3, a Typical line represents a transfer function of a typical PA. A Fast line represents a transfer function of a fast PA in a fast corner of a manufacturing process. A Slow line represents a transfer function of a slow PA in a slow corner of a manufacturing process.

Relative to the typical results of the manufacturing process, the fast corner may produce one or more of transistors with higher carrier mobility, interconnects with reduced resistor-capacitor (RC) delays, and the like. The slow corner may produce one or more of transistors with lower carrier mobility, interconnects with increased RC delays, and the like.

The maximum output power $P_{SAT\_F}$ of the fast PA is greater than the maximum output power $P_{SAT\_T}$ of the typical PA. The maximum output power $P_{SAT\_S}$ of the slow PA is less than the maximum output power $P_{SAT\_T}$ of the typical PA. Each of the fast, typical, and slow PAs produce the respective maximum output power $P_{SAT\_F}$, $P_{SAT\_T}$, and $P_{SAT\_S}$ at a substantially identical pre-distortion input saturation value $INP_{SAT}$, shown as 1000 in FIG. 3.

In addition, the transfer functions of each of the fast, typical, and slow PAs may be substantially different from each other. For example, in the embodiments illustrated in FIG. 3, the transfer function of the slow PA is substantially less nonlinear than the transfer function of the typical PA, and the transfer function of the fast PA is substantially more nonlinear than the transfer function of the typical PA.

Figure 4:
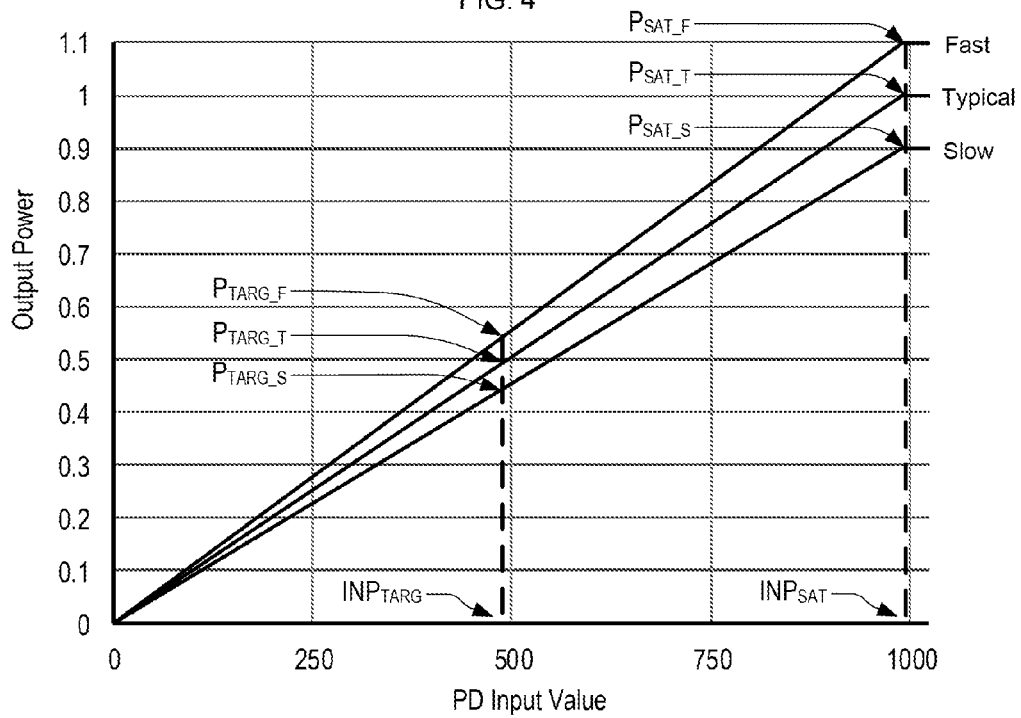
FIG. 4 illustrates an operation of pre-distortion circuits and amplifiers according to an embodiment.

FIG. 4 illustrates combined transfer functions of PDs and PAs according to an embodiment. In particular, FIG. 4 illustrates how the combined transfer functions of a plurality of otherwise identical devices including a PD and a PA, such as the device 100 of FIG. 1, may vary according to variations in a manufacturing process, even when all of the devices are operating under the same conditions.

In FIG. 4, a Typical line represents a combined transfer function of the PD and PA of a typical device wherein the PA is a typical PA such as described with respect to FIG. 3. A Fast line represents a combined transfer function of the PD and PA of a fast device wherein the PA is a fast PA such as described with respect to FIG. 3. A Slow line represents a combined transfer function of the PD and PA of a slow device wherein the PA is a slow PA such as described with respect to FIG. 3.

In each of the typical, fast, and slow devices, the response of the respective PA is linearized by the respective PD. In each of the typical, fast, and slow devices, the respective maximum output power $P_{SAT\_F}$, $P_{SAT\_T}$, and $P_{SAT\_S}$ is equal to the maximum output power of the respective PA. Accordingly, the fast device and the slow device have a higher maximum output power $P_{SAT\_F}$ and a lower maximum output power $P_{SAT\_S}$, respectively, than the maximum output power $P_{SAT\_T}$ of typical device.

In an embodiment, the typical, fast, and slow devices all produce the respective maximum output power $P_{SAT\_F}$, $P_{SAT\_T}$, and $P_{SAT\_S}$ at a same pre-distortion input saturation value $INP_{SAT}$. In an embodiment, the value of the pre-distortion input saturation value $INP_{SAT}$ may be determined by the design of the devices.

In an embodiment, a pre-distortion input target value $INP_{TARG}$ may be determined by subtracting an offset from the pre-distortion input saturation value $INP_{SAT}$. For example, in the embodiment illustrated in FIG. 4, the pre-distortion input target value $INP_{TARG}$ may be equal to the pre-distortion input saturation value $INP_{SAT}$ minus 527.

In another embodiment, the pre-distortion input target value $INP_{TARG}$ may be determined as a fraction of the pre-distortion input saturation value $INP_{SAT}$. For example, in the embodiment illustrated in FIG. 4, the pre-distortion input target value $INP_{TARG}$ may be equal to about 48% of the pre-distortion input saturation value $INP_{SAT}$.

Because the pre-distortion input target value $INP_{TARG}$ is an offset from or at a constant ratio with respect to the pre-distortion input saturation value $INP_{SAT}$ that produces the maximum output power $P_{SAT}$ at the output of the PA, and the fast, typical, and slow devices each have the different respective maximum output power $P_{SAT\_F}$, $P_{SAT\_T}$, and $P_{SAT\_S}$, the fast, typical and slow devices will each have a different respective target output power $P_{TARG\_F}$, $P_{TARG\_T}$, and $P_{TARG\_S}$ for a PD input value of the pre-distortion input target value $INP_{TARG}$, as shown in FIG. 4. In an embodiment, the pre-distortion input target value $INP_{TARG}$ causes the fast, typical, and slow devices to produce respective target output powers $P_{TARG\_F}$, $P_{TARG\_T}$, and $P_{TARG\_S}$ that is six decibels (6 dB) less than the respective maximum output powers $P_{SAT\_F}$, $P_{SAT\_T}$, and $P_{SAT\_S}$.

However, because of the linearization performed by the PD, a signal quality metric of the output of the PA of each of the fast, typical, and slow devices, such as a distortion metric, an ACLR metric, or an EVM metric, will be substantially the same when the fast, typical, and slow devices operate using the pre-distortion input target value $INP_{TARG}$, even though the respective target output power $P_{TARG\_F}$, $P_{TARG\_T}$, and $P_{TARG\_S}$ of each of the fast, typical, and slow device will be different.

In an embodiment, a target value of a signal quality metric of the output of the PA may vary according to operational conditions, and the offset or ratio used to calculate the pre-distortion input target value $INP_{TARG}$ from the pre-distortion input saturation value $INP_{SAT}$ may vary according to the target value of a signal quality metric.

Figure 5:
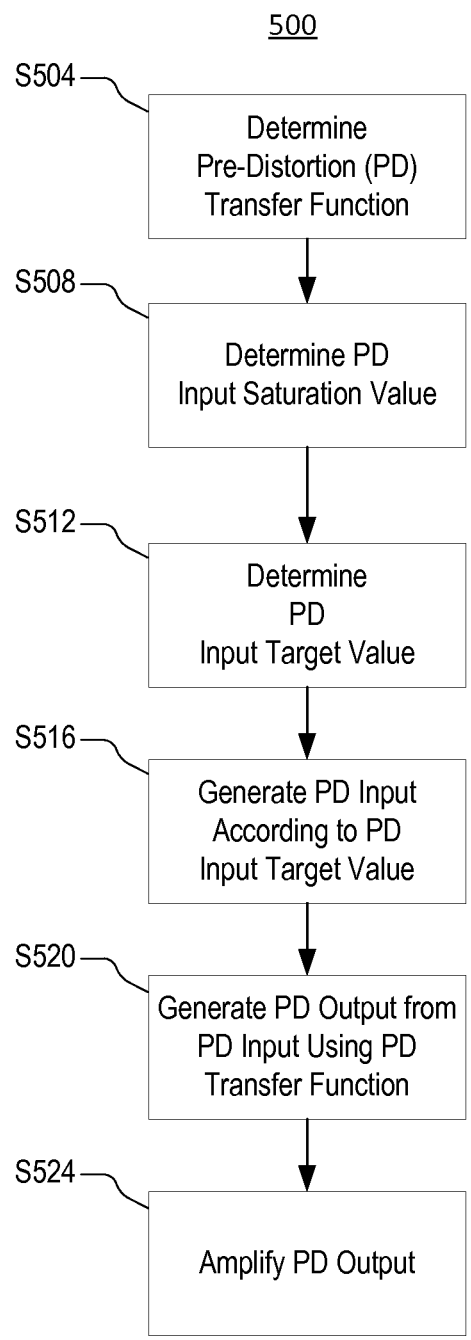
FIG. 5 is a flowchart illustrating a process for pre-distortion based power control according to an embodiment.

FIG. 5 is a flowchart illustrating a process 500 for pre-distortion based power control according to an embodiment. The process may be carried out by a device such as the device 100 of FIG. 1. Although the flowchart shows the process being carried out in a particular order, embodiments are not limited thereto.

At S504, a pre-distortion (PD) transfer function is determined according to a transfer function of an amplifier. In an embodiment, the PD transfer function is substantially an inverse of the transfer function of the amplifier.

In an embodiment, the transfer function of the amplifier includes an amplitude nonlinearity. In an embodiment, the transfer function of the amplifier includes a phase nonlinearity. In an embodiment, the transfer function of the amplifier includes a memory effect.

In an embodiment, the PD transfer function is determined at a design stage of a device.

In an embodiment, the PD transfer function is determined by a first calibration process or training process. The first calibration or training process may be performed either during manufacture of the device, during operation of the device after manufacture, or both.

At S508, a PD input saturation value is determined that corresponds to a value at an input of a PD circuit or PD module that produces a saturation output power of the amplifier.

In an embodiment, the PD input saturation value is determined by the design of the device.

In another embodiment, the PD input saturation value is determined using a second calibration process. The second calibration process may be performed either during manufacture of the device, during operation of the device after manufacture, or both.

At S512, a PD input target value is determined according to the PD input saturation value. In an embodiment, the PD input target value is determined by subtracting an offset from the PD input saturation value. In an embodiment, the PD input target value is determined by multiplying the PD input saturation value by a ratio.

In an embodiment, the offset or ratio used to determine the PD input target value may be determined according to a target value of a signal quality metric of the output of the amplifier. In an embodiment, the target value of the signal quality metric may be varied during the operation of the device.

At S516, a PD input signal is generated according to the PD input target value. In an embodiment, the PD input signal is generated so as to have an average value substantially equal to the PD input target value. In an embodiment, the PD input signal is generated so as to have a Root-Mean-Square (RMS) value substantially equal to the PD input target value.

At S520, a PD output signal is generated by applying the PD transfer function to the PD input signal.

At S524, the PD output signal is amplified by the amplifier to produce the output of the amplifier.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. An apparatus comprising:
   an amplifier; and
   a pre-distortion circuit coupled to an input of the amplifier and receiving an input signal,
   wherein a saturation value of the input signal of the pre-distortion circuit corresponds to a maximum output power of an output signal of the amplifier, and
   wherein an input target value of the input signal is determined according to the saturation value, the input target value being different from the saturation value and corresponding to a target output power of the output signal of the amplifier.

2. The apparatus of claim 1, wherein the input target value is determined by subtracting an offset from the saturation value.

3. The apparatus of claim 1, wherein the input target value is determined by multiplying a ratio by the saturation value.

4. The apparatus of claim 1, wherein the input target value is determined according to a target value of a signal quality metric of the output signal of the amplifier.

5. The apparatus of claim 1, wherein an average value of the input signal is controlled to be substantially equal to the input target value.

6. The apparatus of claim 1, wherein a Root-Mean-Square (RMS) value of the input signal is controlled to be substantially equal to the input target value.

7. The apparatus of claim 1, wherein a transfer function of the amplifier is substantially nonlinear, and
   wherein a combined transfer function of the pre-distortion circuit and the amplifier is substantially linear.

8. The apparatus of claim 7, wherein the combined transfer function is substantially linear for a range of values of the input signal from a minimum power value to the saturation value.

9. The apparatus of claim 1, wherein the pre-distortion circuit is a digital pre-distortion circuit.

10. The apparatus of claim 1, wherein an output power of the output signal of the amplifier corresponding to the input target value varies according to variations in a manufacturing process of the apparatus.

11. The apparatus of claim 1, wherein the amplifier is a digital power amplifier.

12. The apparatus of claim 1, wherein the apparatus is provided using an integrated circuit.

13. A method comprising:
   determining an input target value of an input signal of a pre-distortion circuit according to a saturation value of the input signal, the input target value being different from the saturation value and corresponding to a target output power of an output signal of an amplifier, the saturation value corresponding to a maximum output power of the output signal of the amplifier; and
   controlling the input signal according to the input target value.

14. The method of claim 13, further including:
   pre-distorting the input signal to produce a pre-distortion output signal using the pre-distortion circuit; and
   amplifying the pre-distortion output signal using the amplifier.

15. The method of claim 14, wherein a first transfer function relating the pre-distortion output signal to the output signal of the amplifier is substantially nonlinear, and a second transfer function relating the input signal of the pre-distortion circuit to the output signal of the amplifier is substantially linear.

16. The method of claim 14, wherein determining the input target value includes determining the input target value according to a target value of a signal quality metric of the output signal of the amplifier.

17. The method of claim 13, wherein determining the input target value includes subtracting an offset from the saturation value.

18. The method of claim 13, wherein determining the input target value includes multiplying a ratio by the saturation value.

19. The apparatus of claim 4, wherein the signal quality metric is an adjacent channel leakage ratio (ACLR) metric.

* * * * *